United States Patent
Nakagawa et al.

(10) Patent No.: US 9,640,754 B2
(45) Date of Patent: May 2, 2017

(54) PROCESS FOR PRODUCING MAGNETORESISTIVE EFFECT ELEMENT

(71) Applicant: CANON ANELVA CORPORATION, Kawasaki-shi, Kanagawa (JP)

(72) Inventors: Yukito Nakagawa, Kawasaki (JP); Yoshimitsu Kodaira, Kawasaki (JP); Motozo Kurita, Kawasaki (JP); Takashi Nakagawa, Kawasaki (JP)

(73) Assignee: CANON ANELVA CORPORATION, Kawasaki-Shi, Kanagawa (JP)

( * ) Notice: Subject to any disclaimer, the term of this patent is extended or adjusted under 35 U.S.C. 154(b) by 0 days.

(21) Appl. No.: 14/443,566

(22) PCT Filed: Nov. 11, 2013

(86) PCT No.: PCT/JP2013/080374
§ 371 (c)(1),
(2) Date: May 18, 2015

(87) PCT Pub. No.: WO2014/080782
PCT Pub. Date: May 30, 2014

(65) Prior Publication Data
US 2015/0311432 A1 Oct. 29, 2015

(30) Foreign Application Priority Data

Nov. 20, 2012 (JP) .................. 2012-254446

(51) Int. Cl.
*H01L 21/00* (2006.01)
*H01L 43/12* (2006.01)
(Continued)

(52) U.S. Cl.
CPC .............. *H01L 43/12* (2013.01); *H01L 43/02* (2013.01); *H01L 43/08* (2013.01); *H01L 43/10* (2013.01)

(58) Field of Classification Search
CPC ....................................................... H01L 43/12
(Continued)

(56) References Cited

U.S. PATENT DOCUMENTS 7,745,324 B1 * 6/2010 Yang ................. H01L 21/02068
257/E21.304
8,975,089 B1 * 3/2015 Jung ....................... H01L 43/12
257/295
(Continued)

FOREIGN PATENT DOCUMENTS

EP 1 926 158 A1 5/2008
JP 11-330589 A 11/1999
(Continued)

OTHER PUBLICATIONS

Written Opinion of the International Searching Authority (PCT/ISA/237) mailed on Feb. 4, 2014, by the Japanese Patent Office as the International Searching Authority for International Application No. PCT/JP2013/080374 (w/English translation—8 total pages).
(Continued)

*Primary Examiner* — Igwe U Anya
(74) *Attorney, Agent, or Firm* — Buchanan Ingersoll & Rooney PC

(57) ABSTRACT

This invention provides a production process in which in a process for producing a magnetoresistive effect element, noble metal atoms in a re-deposited film adhered to a side wall after element isolation are efficiently removed to prevent short-circuiting due to the re-deposited film.
The noble metal atoms are selectively removed from the re-deposited film by applying an ion beam, formed using a plasma of a Kr gas or a Xe gas, to the re-deposited film formed on the side wall of the magnetoresistive effect element after the element isolation.

13 Claims, 9 Drawing Sheets

(51) Int. Cl.
*H01L 43/08* (2006.01)
*H01L 43/02* (2006.01)
*H01L 43/10* (2006.01)

(58) Field of Classification Search
USPC .......................................................... 438/3
See application file for complete search history.

(56) References Cited

U.S. PATENT DOCUMENTS

| | | | |
|---|---|---|---|
| 2004/0020894 A1* | 2/2004 | Williams | B82Y 10/00 216/14 |
| 2005/0048675 A1 | 3/2005 | Ikeda | |
| 2008/0073750 A1* | 3/2008 | Kanaya | G11C 11/22 257/532 |
| 2010/0155231 A1 | 6/2010 | Watanabe et al. | |
| 2011/0198314 A1* | 8/2011 | Wang | B82Y 25/00 216/22 |
| 2012/0052258 A1* | 3/2012 | Op De Beeck | H01L 43/12 428/195.1 |
| 2012/0244639 A1* | 9/2012 | Ohsawa | H01L 43/12 438/3 |
| 2012/0326252 A1* | 12/2012 | Yamakawa | H01L 27/222 257/421 |
| 2013/0069182 A1 | 3/2013 | Ohsawa et al. | |
| 2013/0248355 A1* | 9/2013 | Ohsawa | H01L 43/12 204/192.34 |
| 2013/0288394 A1* | 10/2013 | Kontos | H01L 43/02 438/3 |

FOREIGN PATENT DOCUMENTS

| | | |
|---|---|---|
| JP | 2003-078184 A | 3/2003 |
| JP | 2005-268349 A | 9/2005 |
| JP | 2011-166157 A | 8/2011 |
| JP | 2013-069788 A | 4/2013 |
| JP | 2013-197397 A | 9/2013 |
| TW | I 413117 B | 10/2013 |

OTHER PUBLICATIONS

English Translation of the Taiwan Office Action for Taiwan Application No. 102142082 dated Mar. 27, 2015.
D.C. Worledge et al., "Spin torque switching of perpendicular Ta | CoFeB | MgO-based magnetic tunnel junctions", Applied Physics Letters, 2011, 022501-1 through 022501-3, vol. 98. (3 pages).
International Search Report (PCT/ISA/210) mailed on Feb. 4, 2014, by the Japanese Patent Office as the International Searching Authority for International Application No. PCT/JP2013/080374.
Taiwan Office Action for Taiwan Application No. 102142082 dated Mar. 27, 2015.
Office Action (Notification of Reasons for Refusal) issued on Jul. 5, 2016, by the Japanese Patent Office in corresponding Japanese Patent Application No. 2014-548515, and English Translation of the Office Action. (6 pages).
Office Action issued in corresponding Chinese Patent Application No. 201380060677.8, dated Sep. 8, 2016, and English Translation (12 pages).

* cited by examiner

PROCESS FOR PRODUCING MAGNETORESISTIVE EFFECT ELEMENT

TECHNICAL FIELD

The present invention relates to a process for producing a magnetoresistive effect element.

BACKGROUND ART

Magnetic Random Access Memory (MRAM) is a non-volatile memory having a TMR element using a magnetoresistive effect (Tunneling Magneto Resistive: TMR) and has integration density similar to Dynamic Random Access Memory (DRAM) and a highspeed performance similar to Static Random Access Memory (SRAM), and the world pays attention to MRAM as a revolutionary next-generation memory in which data is rewritten repeatedly.

As the TMR element for MRAM, a perpendicular magnetization TMR element (hereinafter also referred to as a P-TMR element) suitable for high integration has been extensively used (see, Non-Patent Literature 1).

As a method of processing the TMR element, an ion beam etching (IBE) technique and a reactive ion etching (RIE) technique are used. It is known that processing is performed using an RIE method using a mixed gas of hydrocarbon and oxygen as an etching gas, for example, whereby a metal film in a magnetoresistive effect element can be selectively etched (see, Patent Literature 1).

PRIOR ART REFERENCE

Patent Literature

Patent Literature 1: Japanese Patent Application Laid-Open No. 2005-268349

Non Patent Literature

Non Patent Literature 1: D. C. Worledge et al., Applied Physics Letters (Appl. Phys. Lett), 98, (2011) 022501

SUMMARY OF THE INVENTION

Problem to be Solved by the Invention

When the TMR element is element-isolated using the above-described etching technique, a re-deposited film formed of an etched material deposited after etching is formed on a side wall of the element-isolated TMR element. Such a re-deposited film contains many metal materials, and when the re-deposited film is adhered to a side wall of a tunnel barrier layer, a current passing through a reference layer and a free layer passes through the re-deposited film on the side wall, so that a function as the element is lost.

In order to prevent short-circuiting of the current, the re-deposited film adhered to the side wall is required to become an insulator through oxidation reaction, nitriding reaction, or the like.

Meanwhile, the P-TMR element includes a film formed of a large number of noble metals such as Pd, Pt, and Ru, and the re-deposited film after etching contains a large amount of noble metal atoms. Since such noble metal atoms are chemically stable, the rates of reactions of oxidation and nitriding are slow in comparison with other atoms. Thus, when the noble metal atoms in the re-deposited film are to be completely converted into an isolator, oxidation and nitriding of other atoms in the element are progressed to deteriorate element characteristics.

The present invention has been made based on the above problem, and an object of the invention is to provide a process for producing a TMR element including a process for selectively removing noble metal atoms in a re-deposited film adhered to a side wall of the TMR element after etching process.

Means for Solving the Problem

In order to solve the above problem, according to the present invention, noble metal atoms contained in a re-deposited film formed on a side wall of a TMR element are selectively etched from other metal atoms, using an ion beam using a Kr gas or a Xe gas.

More specifically, the present invention provides a process for producing a magnetoresistive effect element having two ferromagnetic layers and a tunnel barrier layer located between the two ferromagnetic layers. This production process includes a process for applying anion beam to a metal material adhered to the side wall of the tunnel barrier layer. The ion beam is formed using a plasma of a Kr gas or a Xe gas.

Eeffects of the Invention

In the present invention, in the process for applying the ion beam using a Kr gas or a Xe gas to the re-deposited film adhered to the side wall of the TMR element after etching process, noble metal atoms in the re-deposited film can be selectively removed. Thus, according to this invention, short-circuiting due to the re-deposited film can be reduced by selective removal of the noble metal atoms. It is possible to reduce a time, when the ion beam is applied to the re-deposited film, for reducing the short-circuiting or a reaction time for converting a metal material, contained in the re-deposited film, into an insulator, so that a TMR element having more excellent element characteristics can be produced.

MODE FOR CURRYING OUT THE INVENTION

Figure 1:
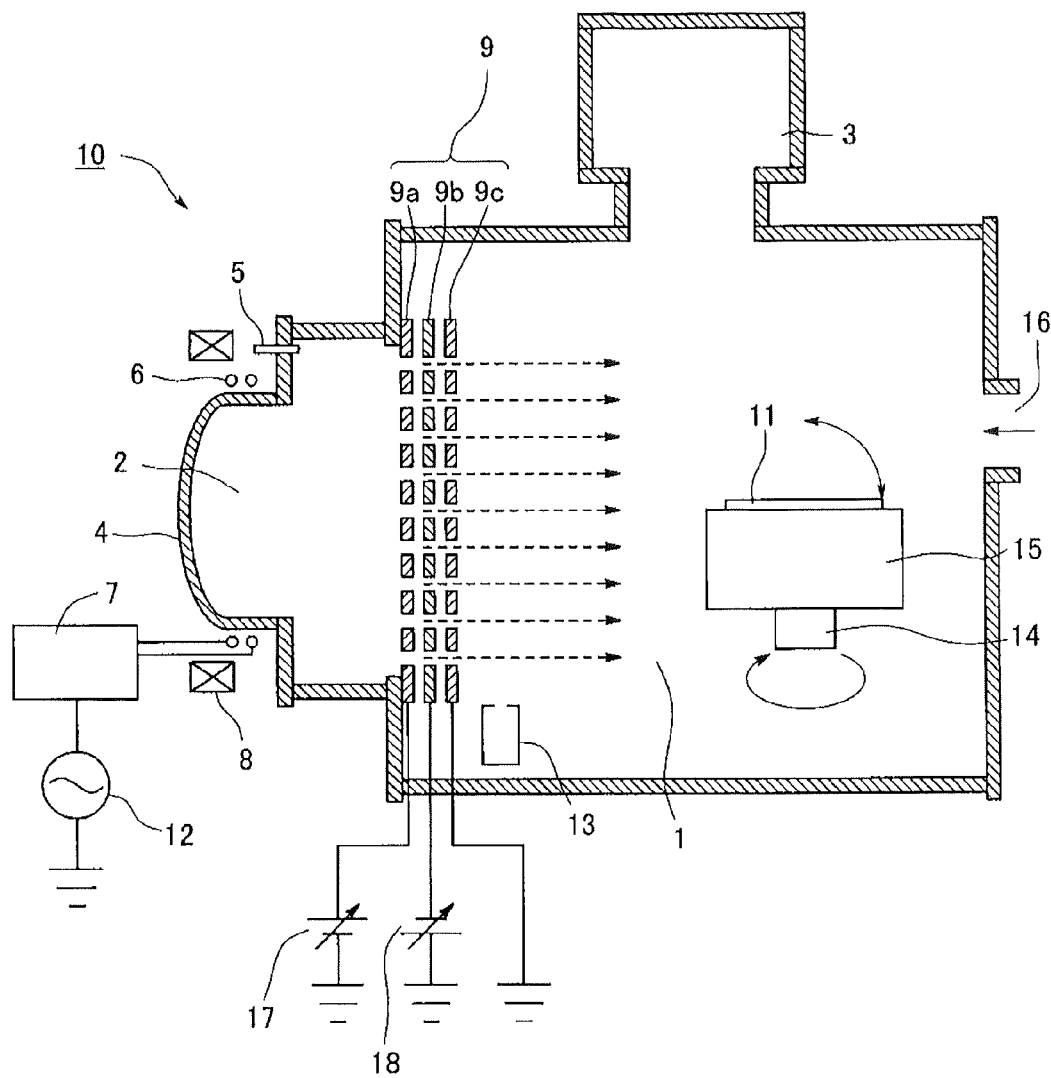
FIG. 1 is a cross-sectional pattern diagram showing an example of an IBE apparatus with which the present invention is practicable.

Hereinafter, although embodiments of the present invention will be described with reference to the drawings, this invention is not limited to the embodiments and may be suitably modified without departing from the scope of the invention. In the drawings to be described below, the same functional elements are indicated by the same reference numerals, and descriptions thereof will not be repeated.
(First Embodiment)

FIG. 1 is a schematic view of an IBE apparatus allowing an IBE processing according to the present invention. The IBE apparatus 10 is constituted of a substrate processing chamber 1 and a plasma generation chamber as a plasma source. The substrate processing chamber 1 includes an exhaust pump 3. The plasma generation chamber 2 includes a bell jar 4, a gas introduction portion 5, an RF antenna 6, a matching device 7, and an electromagnet 8. A boundary portion between the substrate processing chamber 1 and the plasma generation chamber 2 includes a grid 9.

The grid 9 is constituted of a plurality of sheets of electrodes. In the present invention, the grid 9 is constituted of three sheets of electrodes as shown in, for example, FIG. 1. A first electrode 9a, a second electrode 9b, and a third electrode 9c are arranged in this order from the bell jar 4 side. Positive and negative voltages are applied respectively to the first electrode 9a and the second electrode 9b, whereby ions are accelerated by a potential difference. The third electrode 9c is also called an earth electrode and is grounded. When the potential difference between the second electrode 9b and the third electrode 9c is controlled, the diameter of an ion beam can be controlled within a predetermined numerical value range using an electrostatic lens effect. The ion beam is neutralized by a neutralizer 13. The first electrode 9a and the second electrode 9b are connected respectively to power supplies 17 and 18 for applying a predetermined voltage.

The grid 9 is preferably formed of a material having resistance against a reactive gas. Examples of the material of the grid 9 include molybdenum and titanium, or the like. The grid 9 may be formed of other material than those exemplified, and its surface may be coated with molybdenum or titanium.

The substrate processing chamber 1 includes a substrate holder 15 connected to an Electrostatic Chuck (ESC) electrode (not shown). The ESC electrode allows a substrate 11 placed on the substrate holder 15 to be fixed by electrostatic attraction. As other substrate fixing means, various fixing means such as clamp supporting may be used. A process gas is introduced from the gas introduction portion 5, and a high frequency wave is applied to the RF antenna 6, whereby a plasma of the process gas can be generated in the plasma generation chamber 2. Then, a direct-current voltage is applied to the grid 9 to extract ions as a beam from the plasma generation chamber 2, and, thus, to apply the ion beam to the substrate 11, whereby the substrate 11 is processed. The extracted ion beam is electrically neutralized by the neutralizer 13 and applied to the substrate 11.

The substrate holder 15 allows the substrate 11 to rotate (on its axis) in its in-plane direction. The substrate holder 15 has rotation control means for controlling a rotation speed of the substrate, the number of times of rotation of the substrate, and inclination of the substrate holder 15 relative to the grid 9 and means for detecting a rotation position of the substrate 11. The substrate holder 15 may further have means allowing detection of inclination of the substrate holder 15 relative to the grid 9 and a rotation start position of the substrate 11. In this embodiment, the substrate holder 15 is equipped with a position sensor 14 as position detection means, and the position sensor 14 can detect the rotation position of the substrate 11. As the position sensor 14, a rotary encoder is used.

The substrate 11 is carried into the substrate processing chamber 1 through a substrate carry-in entrance 16 and held on a placing surface of the substrate holder 15 while keeping its horizontal state. The substrate holder 15 can arbitrarily incline relative to an ion beam. The substrate 11 is constituted of a disk-shaped silicon wafer, for example.

Figure 2:
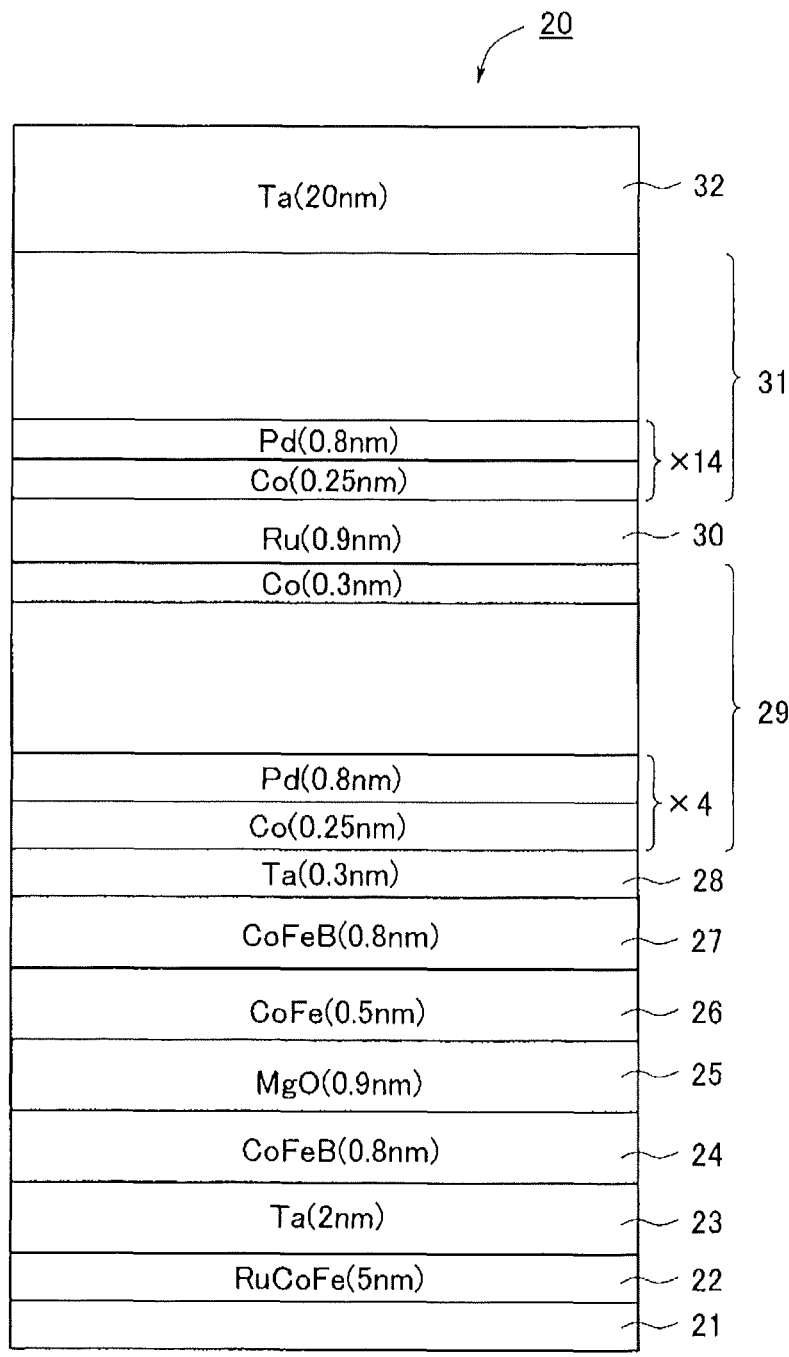
FIG. 2 is a cross-sectional pattern diagram showing an example of a configuration of a TMR element to which this invention is applicable.

Next, an example of a structure of a TMR element produced according to the present invention will be described using FIG. 2. FIG. 2 is a pattern diagram of a laminate structure of a P-TMR element 20 including a ferromagnetic layer magnetized in a film-thickness direction. In FIG. 2, numbers in parentheses represent film thickness. In the P-TMR element 20 of this example, first, an RuCoFe layer as a buffer layer 22 and a Ta layer as a buffer layer 23 are formed on a substrate 21. A CoFeB layer as a free layer 24 which is a ferromagnetic layer is formed on the buffer layer 23, and an MgO layer as a tunnel barrier layer 25 is formed on the free layer 24. The tunnel barrier layer 25 is preferably formed of MgO to obtain a high MR ratio. The tunnel barrier layer 25 may further contain an oxide containing at least one or two or more kinds of Mg, Al, Ti, Zn, Hf, and Ge. A CoFe layer as a first reference layer 26 which is a ferromagnetic layer is formed on the tunnel barrier layer 25, a CoFeB layer as a second reference layer 27 which is a ferromagnetic layer is formed on the first reference layer 26, a Ta layer as an orientation isolation layer 28 is formed on the second reference layer 27, and a third reference layer 29 is formed on the orientation isolation layer 28. The third reference layer 29 has a laminate structure containing Co and Pd. In this embodiment, after Co and Pd are alternately laminated four times, Co is film-formed.

Then, an Ru layer as a nonmagnetic interlayer 30, a fourth reference layer 31, and a Ta layer 32 as a cap layer 32 are film-formed. The fourth reference layer 31 has a laminate structure containing Co and Pd alternately laminated fourteen times.

As shown in FIG. 2, the P-TMR element 20 particularly has many noble metal films. Thus, when a magnetoresistive effect film formed on the substrate 21 is element-isolated by etching, a re-deposited film containing many noble metal atoms is adhered to a side wall of the element.

The element isolation according to the present invention means a state in which films deposited on a substrate are patterned in sequence from the top, and at least films up to an insulating film functioning as a tunnel barrier layer are patterned.

An IBE method according to the present invention for efficiently removing noble metal atoms contained in the re-deposited film will be hereinafter described using FIGS. 3 to 6.

Figure 3:
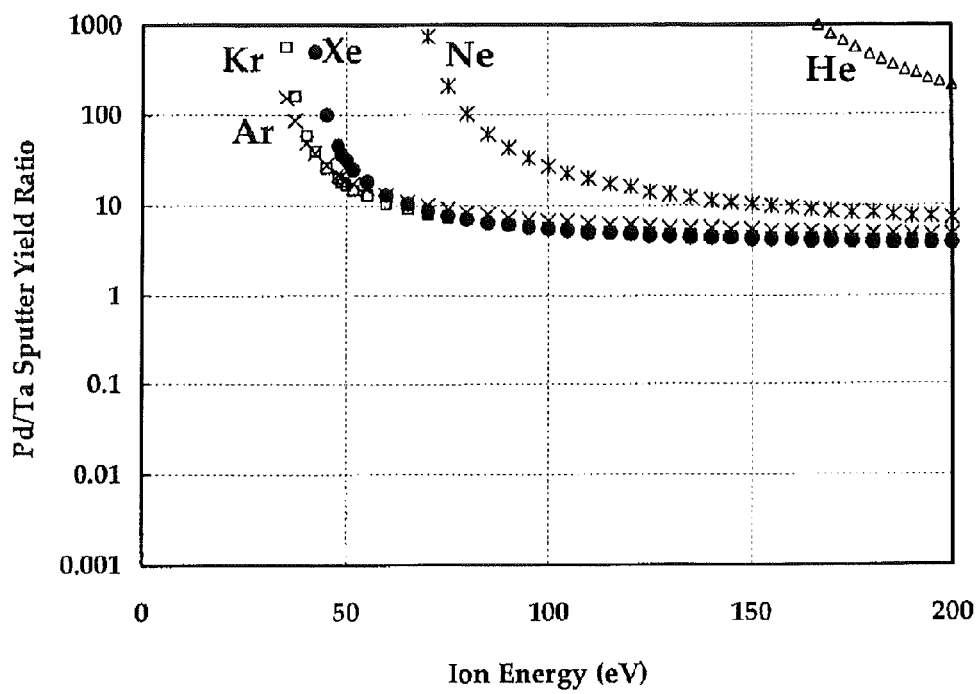
FIG. 3 is a view showing selectivity to noble metals of various rare gas in IBE.

FIG. 3 is a view showing a relationship between an ion energy and a ratio of sputtering rates of Ta and Pd when IBE of Ta and Pd is performed using various rare gases. The horizontal axis represents an energy of an ion beam determined by a voltage applied to the grid 9. The vertical axis represents the sputtering rate of Pd to the sputtering rate of Ta . Various rare gases are introduced into a plasma generation chamber to generate a plasma, and the ion beam is extracted from the plasma and then applied to a material to be etched, whereby IBE using various rare gases is performed.

The sputtering rate to various rare gases of each material was calculated by using a method described in "Energy Dependence of the Yields of Ion-Induced Sputtering of Monatomic Solids" (N. Matsunami and eight other persons, IPPJ-AM-32 (Institute of Plasma Physics, Nagoya University, Japan, 1983)).

As seen in FIG. 3, Pd is selectively etched with respect to Ta independently of the kind of rare gas.

Figure 4:
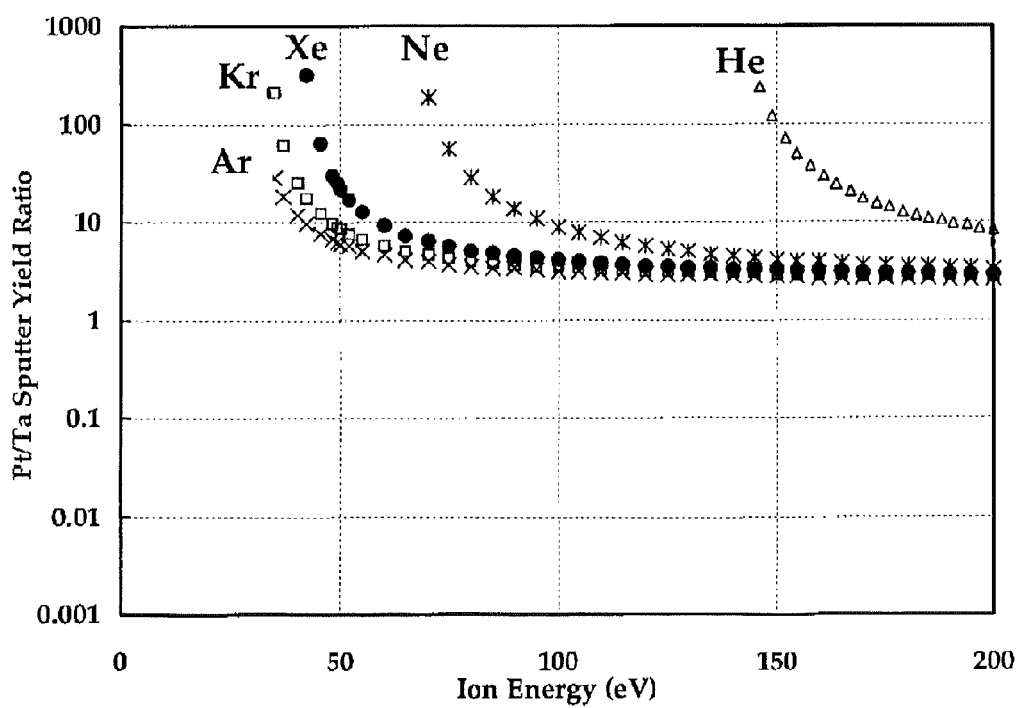
FIG. 4 is a view showing the selectivity to the noble metals of the various rare gas in IBE.

FIG. 4 shows a relationship between the ion energy and a ratio of sputtering rates of Ta and Pt when IBE of Ta and Pt is performed using various rare gases of He, Ne, Ar, Kr, and Xe . The horizontal axis represents the energy of the ion beam determined by the voltage applied to the grid 9. The vertical axis represents the sputtering rate of Pt to the sputtering rate of Ta.

As seen in FIG. 4, like Pd, Pt is selectively etched with respect to Ta independently of the kind of rare gas.

Figure 5:
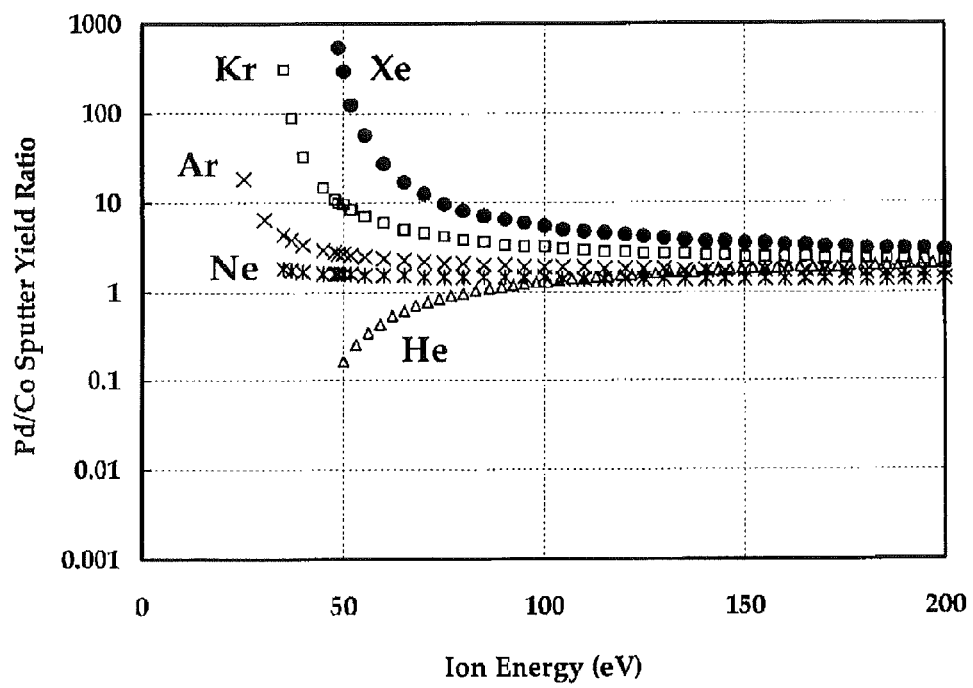
FIG. 5 is a view showing the selectivity to the noble metals of the various rare gas in IBE.

FIG. 5 shows a relationship between the ion energy and a ratio of sputtering rates of Co and Pd when IBE of Co and Pd is performed using various rare gases. The horizontal axis represents the energy of the ion beam determined by the voltage applied to the grid 9. The vertical axis represents the sputtering rate of Pd to the sputtering rate of Co.

As seen in FIG. 5, for the rare gases other than He and Ne, Pd is selectively etched with respect to Co in a low energy band not more than 100 eV. In particular, for a Kr gas and a Xe gas, selectivity not less than ten times is obtained at 50 eV, and it is possible to achieve a process excellent in productivity in terms of an etching rate and its selectivity.

Figure 6:
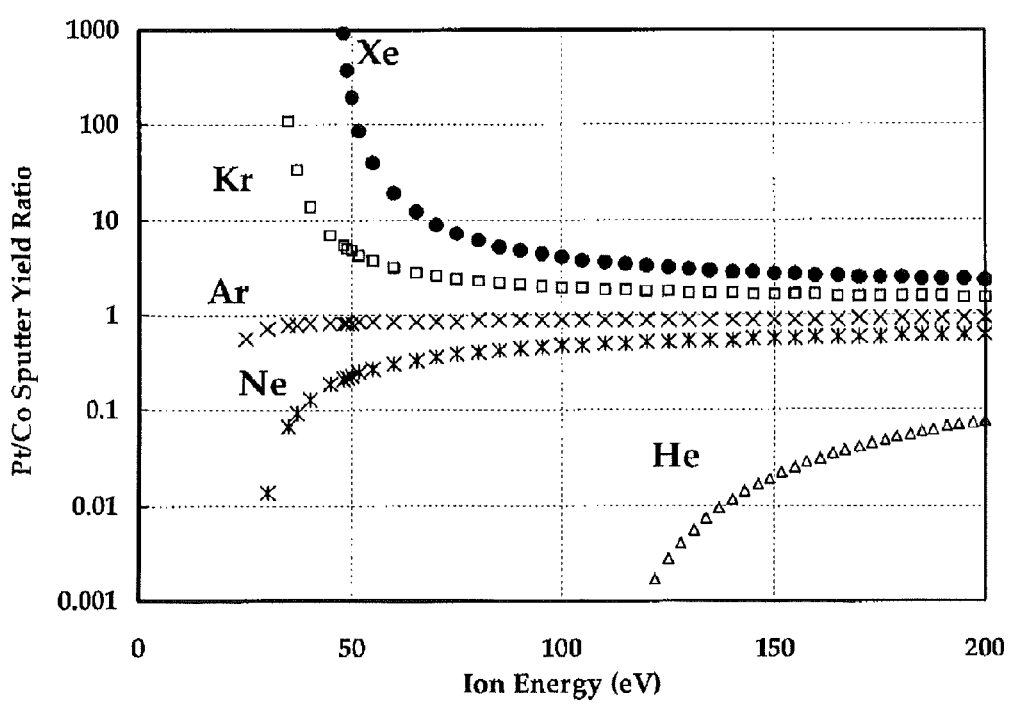
FIG. 6 is a view showing the selectivity to the noble metals of the various rare gas in IBE.

FIG. 6 shows a relationship between the ion energy and a ratio of sputtering rates of Co and Pt when IBE of Co and Pt is performed using various rare gases. The horizontal axis represents the energy of the ion beam determined by the voltage applied to the grid. The vertical axis represents the sputtering rate of Pt to the sputtering rate of Co.

As seen in FIG. 6, for He, the sputtering rate of Pt to the sputtering rate of Co is up to about 0.1 time, and Pt is more hardly etched than Co. For Ne, the sputtering rate does not reach one time, and for Ar, the sputtering rate is up to one time. Thus, when a rare gas such as He, Ne, and Ar is used, it is difficult to selectively etch Pt with respect to Co.

Meanwhile, for Kr and Xe, it is found that Pt is electively etched with respect to Co. In particular, when the energy is reduced to not more than 100 eV, the selectivity of Pt to Co is more noticeable.

As seen in the results shown in FIGS. 3 to 6, when the rare gas such as He, Ne, and Ar is used, it is difficult to selectively etch noble metal atoms from a re-deposited film in which metals contained in a P-TMR element are mixed. Meanwhile, when Kr or Xe is adopted, both Pt and Pd can be selectively etched.

The lower the ion energy, the greater each selectivity of Kr and Xe to noble metal. Meanwhile, the lower the ion energy, the lower the etching rate of each material. Therefore, it is preferable for improving the productivity that the ion energy is as high as possible. When IBE is performed using Xe, noble metal can be selectively etched even with relatively high energy in comparison with Kr, and therefore, it is very advantageous in terms of the productivity.

Considering to the selectivity of etching to noble metal and etching rate, it is preferable that the ion energy is set to not less than 10 eV and not more than 100 eV. This is because in the ion energy set to not more than 10 eV, the sputtering rate to a re-deposited film is small, and processing takes time.

Figure 7:
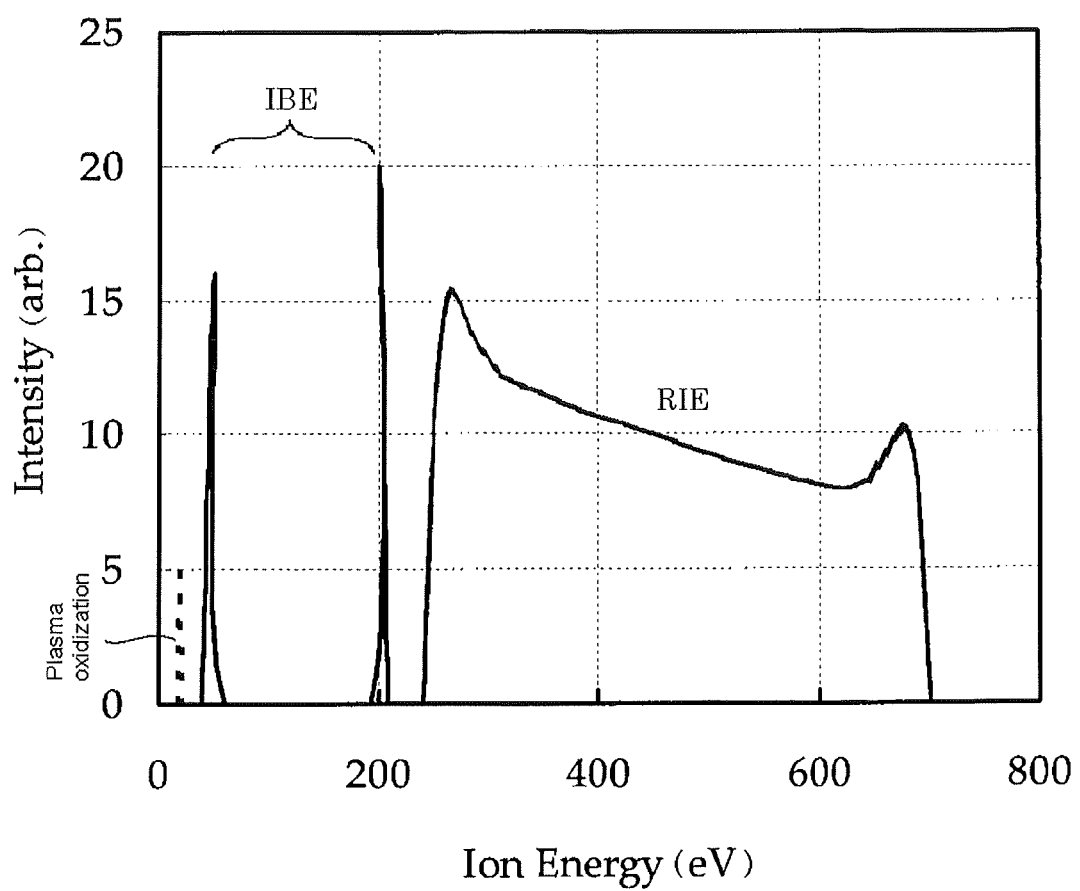
FIG. 7 is a view for explaining distributions of ion energies in IBE and RIE.

The removal of noble metal atoms in a re-deposited film by IBE is excellent in terms of process stability. FIG. 7 is a view showing distributions of the ion energies, entering a substrate, in RIE and IBE. In RIE, although the ion energy is determined by a high-frequency bias potential supplied to the substrate, the potential always varies in accordance with a frequency of a high frequency. Consequently, the energy of ions is spread over a wide range, as shown in FIG. 7, and only ions having a specific energy cannot be irradiated, leading to deterioration of character distribution in a substrate surface and process reproducibility for each processed substrate.

Meanwhile, in IBE, a spread of the energy of each ion in the ion beam is small as shown in FIG. 7, and the ion energy can be controlled to a predetermined value. Thus, according to IBE, it is possible to easily obtain a desired ion energy required from two viewpoints of etching selectivity to noble metal in a re-deposited film and the etching rate of the re-deposited film. Unlike RIE, since the energy is not spread, ions having an ion energy larger than a set energy are unlikely to enter the substrate. Consequently, damage to the substrate can be reduced in comparison with RIE.

Hereinafter, the process for producing a TMR element according to the present invention including a process for removing noble metal atoms from a re-deposited film will be described using a specific production process.

Figure 8A:
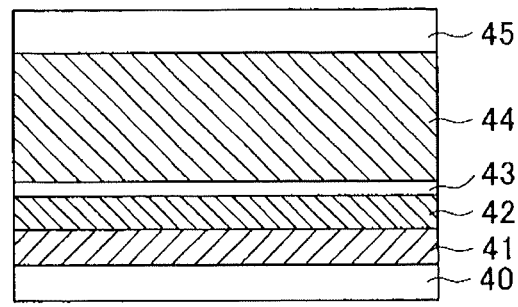
FIGS. 8A to 8C are cross-sectional pattern diagrams showing a process according to a first embodiment of this invention.
Figure 8B:
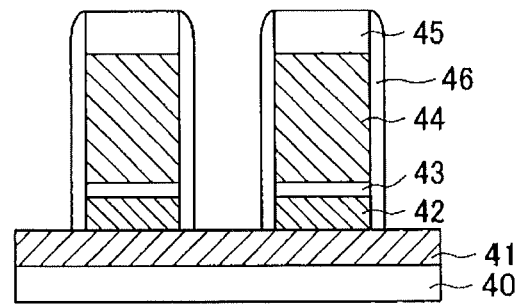
Figure 8C:
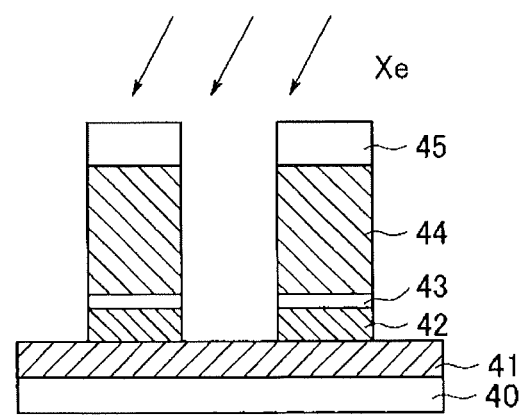

FIGS. 8A to 8C are partially schematic views of a process for producing a TMR element according to this embodiment.

As shown in FIGS. 8A to 8C, a seed layer 41, a free layer 42, a tunnel barrier layer 43, a reference layer 44, and a cap layer 45 are film-formed on a substrate 40 using a sputtering film formation method or the like to form a magnetoresistive effect film. In the TMR element shown in FIGS. 8A to 8C, the TMR element structure shown in FIG. 2 is simplified.

After the film formation of the cap layer 45, element isolation is performed through a predetermined lithography process and a predetermined etching process, as shown in FIG. 8B, to form the TMR element. At that time, a re-deposited film 46 formed in the etching process is present on a side wall of each TMR element. Since the re-deposited film 46 contains a large amount of noble metal atoms of a conductor, the re-deposited film 46 may be causative of short-circuiting.

Then, the TMR element formed with the re-deposited film 46 is irradiated with ion beams using Xe ions, as shown in FIG. 8C, to remove the re-deposited film 46. In this case, the ion beam using Xe ions selectively removes the noble metal atoms contained in the re-deposited film 46. Consequently, the re-deposited film 46 can be easily removed. Alternatively, short-circuiting between the free layer 42 and the reference layer 44 can be reduced by selective removal of many noble metal materials contained in the re-deposited film 46.

(Second Embodiment)

In the above embodiment, the re-deposited film 46 is removed by the IBE processing using Xe ions, or the noble metal material is selectively removed from the re-deposited film 46 to reduce the short-circuiting between the free layer 42 and the reference layer 44. Meanwhile, in this embodiment, the IBE processing using an $O_2$ gas is performed after the IBE processing using Xe ions, whereby the re-deposited film 46 becomes an insulator. According to this embodiment, since the re-deposited film 46 is actively changed into an insulator by chemical reaction, the short-circuiting between the free layer 42 and the reference layer 44 can be reduced more reliably.

FIGS. 9A to 9D are partially schematic views of a process for producing a TMR element according to this embodiment.

Figure 9A:
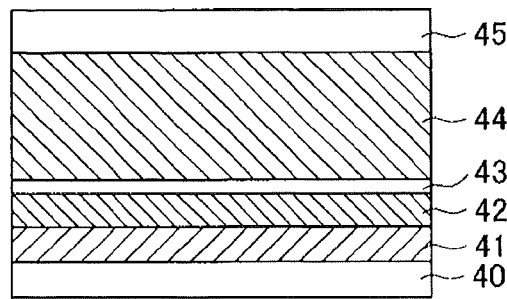
FIGS. 9A to 9D are cross-sectional pattern diagrams showing a process according to a second embodiment of this invention.
Figure 9B:
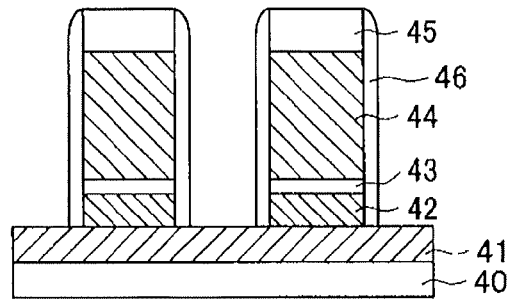

The process shown in FIGS. 9A and 93 is similar to the process according to the first embodiment shown in FIGS. 8A and 8B.

Figure 9C:
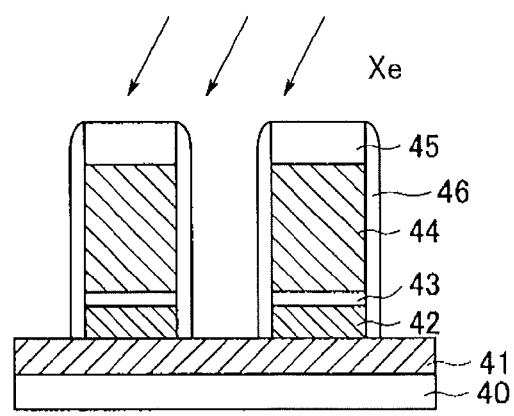

In this embodiment, the TMR element formed with a re-deposited film 46 is irradiated with ion beams using Xe ions, as shown in FIG. 9C. In this process, noble metal atoms contained in the re-deposited film 46 are selectively removed. Consequently, since the noble metal atoms with little or no occurrence of oxidation reaction are removed from the re-deposited film 46, the re-deposited film 46 can easily become an insulator through oxidation reaction. According to this constitution, processing time in the subsequent reaction process allowing the re-deposited film 46 to be converted into an insulator or a pressure of a reactive gas can be reduced, so that damage to the TMR element due to the reactive gas can be reduced.

Figure 9D:
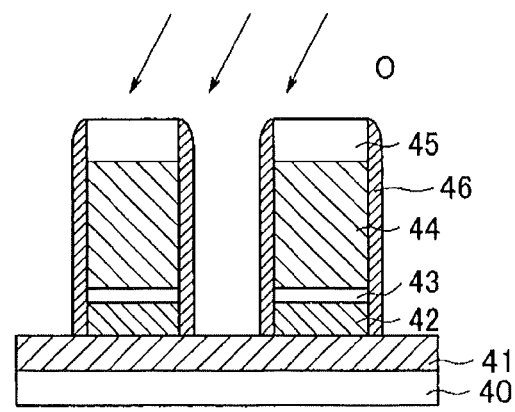

After that, as shown in FIG. 9D, an $O_2$ gas is added to a gas for discharge, and the ion beam is formed to be applied to the TMR element, and, thus, to oxidize the re-deposited film 46, whereby the re-deposited film 46 becomes an insulator.

In the process shown in FIG. 9D, only the $O_2$ gas may be introduced into a plasma generation chamber to form a plasma, and, thus, to apply an ion beam. However, in terms of control of an oxidation rate of the re-deposited film 46, a mixed gas of an $O_2$ gas and a rare gas is preferably used. At this time, as a gas to be mixed with the $O_2$ gas, any rare gas may be used.

As to an oxidation process after the process using a Xe gas shown in FIG. 9C, the oxidation process may be performed after the substrate is moved to another chamber. As a method used in the oxidation, reaction may be developed by exposing the substrate in a reactive plasma in addition to irradiation with an ion beam using a reactive gas.

However, it is preferable that the process using the Xe gas in FIG. 9C and the process using the $O_2$ gas in FIG. 9D are continuously performed by changing a gas introduced into the plasma generation chamber. For example, after the IBE process shown in FIG. 9C is performed for a certain time, the $O_2$ gas is introduced into the plasma generation chamber in addition to the Xe gas, and the oxidation process may be performed subsequently. This is because when the $O_2$ gas is thus introduced into the plasma generation chamber while maintaining the plasma by the Xe gas in the plasma generation chamber, processing time can be reduced.

(Third Embodiment)

In the above embodiment, the IBE processing using the $O_2$ gas is performed after the IBE processing using Xe ions, whereby the re-deposited film 46 becomes an insulator. Meanwhile, in this embodiment, a plasma of a mixed gas of Xe and $O_2$ is formed, and an ion beam is formed from the plasma to apply the IBE processing to the re-deposited film 46, whereby removal of noble metal atoms from the re-deposited film 46 and conversion of the re-deposited film 46 into an insulator are performed simultaneously.

Figure 10A:
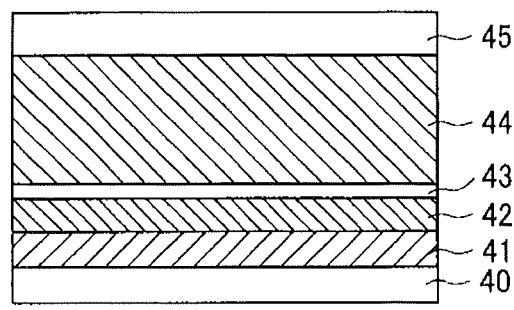
FIGS. 10A to 10C are cross-sectional pattern diagrams showing a process according to a third embodiment of this invention.
Figure 10B:
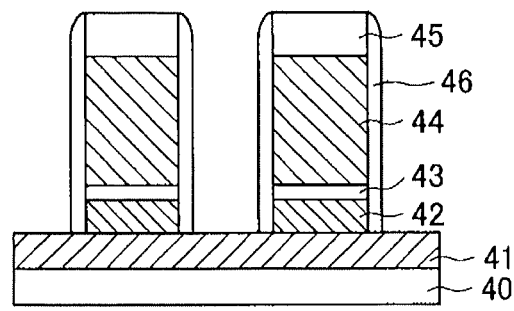
Figure 10C:
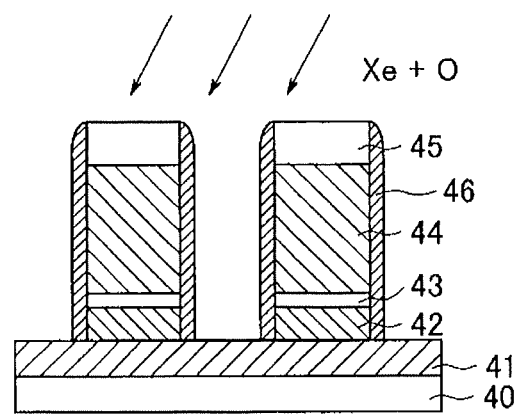

FIGS. 10A to 10C are partially schematic views of a process for producing a TMR element according to this embodiment.

The process shown in FIGS. 10A and 10B is similar to the process according to the first embodiment shown in FIGS. 8A and 8B.

As shown in FIG. 10C, the TMR element formed with the re-deposited film 46 is irradiated with the ion beams formed using the mixed gas of Xe and $O_2$. This process selectively removes the noble metal atoms contained in the re-deposited film 46, and, in addition, oxidation reaction of the re-deposited film 46 progresses.

As in this embodiment, when a mixed gas of Xe and $O_2$ is supplied into a plasma generation chamber to form a plasma, the behavior of atoms in the plasma will be described.

As ions extracted from a plasma of an $O_2$ gas, there are mainly two kinds of ions. One is $O_2^+$ produced by ionization of an oxygen molecule, and the other is $O^+$ produced by dissociative ionization of an oxygen molecule. The abundance of $O_2^+$ is larger than the abundance of $O^+$. The abundance ratio of rare gas ions to oxygen molecule ions determined when an $O_2$ gas and a rare gas are mixed is determined by a ratio of an ionization cross section area of the oxygen molecule to the ionization cross section area of the rare gas. Although the ionization cross section area of Xe is about three times the ionization cross section area of oxygen, the ionization cross section area of Ar is about 0.9 time the ionization cross section area of oxygen, and therefore, the abundance ratio of oxygen ions and rare gas ions in a plasma is different between Xe and Ar, as shown in FIG. 11.

Figure 11:
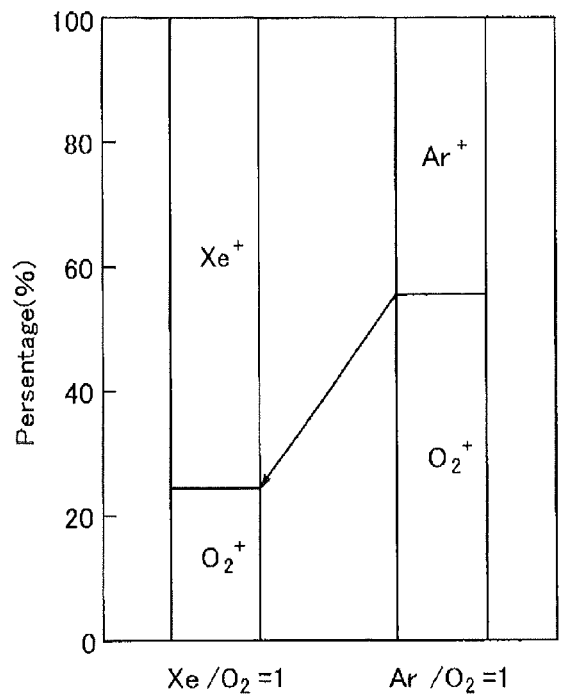
FIG. 11 is a schematic view showing percentages of various ions in a plasma of a mixed gas of a rare gas and an $O_2$ gas.

FIG. 11 is a schematic view showing percentages of rare gas ions and oxygen ions in a plasma of a mixed gas when the plasma is produced while a volume ratio of various rare gases to an $O_2$ gas in the mixed gas is 1:1.

As seen in FIG. 11, when a gas mixing ratio is the same, an amount of oxygen ions in a plasma determined when the oxygen ions are mixed with a Xe gas is not more than half of that determined when the oxygen ions are mixed with an Ar gas.

It is preferable that the re-deposited film 46 formed on a side wall of the TMR element is generally thin thickness, and that the oxidation reaction of the re-deposited film 46 is precisely controlled. When the re-deposited film 46 is excessively oxidized, the oxidation reaction occurs in a film constituting the TMR element inside the re-deposited film 46, and this deteriorates the element characteristics.

As in this embodiment, when the mixed gas of a Xe gas and an $O_2$ gas is used, the rate of oxygen ions in a plasma can be reduced in comparison with a case of using a mixed gas of an Ar gas and an $O_2$ gas or using an $O_2$ gas singly. Thus, a ratio of oxidizability to an $O_2$ gas introduction amount is reduced, and when the $O_2$ gas introduction amount fluctuates, oxidation processing of the re-deposited film 46 is less likely to be affected. Consequently, it is possible to improve uniformity of TMR element characteristics for each substrate.

Further, it is possible to stably perform oxidation processing with respect to fluctuation of each introduction amount of an $O_2$ gas and a Xe gas, a change in a plasma density, and a minute change in process conditions, such as temperature changes in the bell jar 4 and the grid 9, determined when the IBE processing is performed.

Meanwhile, when the supply of active oxygen fails in the processing using a mixed gas of a Xe gas and an $O_2$ gas, a supply source may be provided separately. When an excessive amount of active oxygen is supplied, the content of an $O_2$ gas is reduced to the minimum necessary, whereby damage due to oxygen ion irradiation can be further reduced. When the content of an $O_2$ gas in a mixed gas is reduced, a change in oxidizability due to fluctuation of the $O_2$ gas introduction amount easily appears, and therefore this embodiment is effective particularly.

In the above embodiment, although an $O_2$ gas is used for oxidizing the re-deposited film 46, other oxygen-containing gases such as $N_2O$, $CO_2$, $O_3$, and $H_2O$ may be used.

(Fourth Embodiment)

In the second embodiment, the IBE processing is performed using an oxygen-containing gas to oxidize the re-deposited film 46, and, thus, to convert the re-deposited film 46 into an insulator. Meanwhile, in this embodiment, the IBE processing is performed using a nitrogen-containing gas to convert the re-deposited film 46 as a nitride into an insulator. More specifically, in the process shown in FIG. 9D according to the second embodiment, an $N_2$ gas is added to a discharge gas instead of an $O_2$ gas to form an ion beam, and, thus, to apply the ion beam to the TMR element, whereby the re-deposited film 46 is nitrided to be converted into an insulator.

In this process, only an $N_2$ gas may be introduced into a plasma generation chamber to produce a plasma, and, thus, to apply an ion beam. However, it is preferable in terms of control of a nitriding rate of the re-deposited film 46, a mixed gas of an $N_2$ gas and a rare gas is preferably used. At this time, as a gas to be mixed with the $N_2$ gas, any rare gas may be used.

The process for removing noble metal atoms from the re-deposited film 46 using a Xe gas and the process for nitriding the re-deposited film 46 using an $N_2$ gas may be continuously performed by changing a gas introduced into the plasma generation chamber. For example, after the IBE process using a Xe gas is performed for a certain time, an $N_2$ gas is introduced into the plasma generation chamber in addition to the Xe gas, and the nitriding process may be performed subsequently. When the $N_2$ gas is thus introduced into the plasma generation chamber while maintaining the plasma by the Xe gas in the plasma generation chamber, processing time can be reduced.

(Fifth Embodiment)

In the fourth embodiment, after the IBE processing using Xe ions is performed, the IBE processing is performed using an $N_2$ gas, whereby the re-deposited film 46 becomes an insulator. In this embodiment, a plasma of a mixed gas of Xe and $N_2$ is formed, and an ion beam is formed from the plasma to apply the IBE processing to the re-deposited film 46, whereby removal of noble metal atoms from the re-deposited film 46 and conversion of the re-deposited film 46 into an insulator are performed simultaneously. More specifically, in the process shown in FIG. 10C according to the third embodiment, not an $O_2$ gas but an $N_2$ gas is added to a Xe gas, and an ion beam is formed to be applied to a TMR element, whereby noble metal atoms are selectively removed from the re-deposited film 46, and, at the same time, the re-deposited film 46 is nitrided to be converted into an insulator.

As in this embodiment, when a mixed gas of Xe and $N_2$ is supplied into a plasma generation chamber to form a plasma, the behavior of atoms in the plasma will be described.

As ions extracted from a nitrogen gas plasma, there are mainly two kinds of ions. One is $N_2^+$ produced by ionization of a nitrogen molecule, and the other is $N^+$ produced by dissociative ionization of a nitrogen molecule. The abundance of $N_2^+$ is arger than the abundance of $N^+$. Since the ionization cross section area of the nitrogen molecule is substantially equal to the ionization cross section area of an oxygen gas, the abundance ratio of rare gas ions to nitrogen molecule ions determined when an $N_2$ gas and a rare gas are mixed is different between Xe and Ar, substantially similarly to the case of mixing an $O_2$ gas in FIG. 11.

Figure 12:
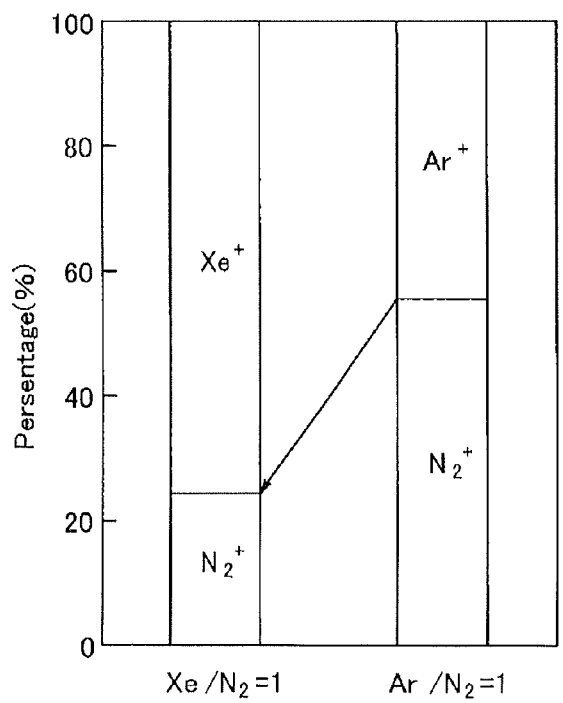
FIG. 12 is a schematic view showing percentages of various ions in a plasma of a mixed gas of a rare gas and an $N_2$ gas.

FIG. 12 is a schematic view showing percentages of rare gas ions and nitrogen ions in a plasma of a mixed gas when the plasma is produced while a volume ratio of various rare gases to an $N_2$ gas in the mixed gas is 1:1.

As seen in FIG. 12, when a gas mixing ratio is the same, an amount of nitrogen ions in the plasma determined when the nitrogen ions are mixed with a Xe gas is not more than half of that determined when the nitrogen ions are mixed with an Ar gas.

It is preferable that the re-deposited film 46 formed on a side wall of the TMR element is generally thin thickness, and that nitrogen reaction of the re-deposited film 46 is precisely controlled. Usually, a nitriding reaction rate of metal is extremely lower than an oxidation reaction rate, and it is difficult to perform surface nitriding using only an $N_2$ gas. However, nitriding is achieved by using nitrogen ions in a plasma or atomic nitrogen.

When the nitriding rate of the re-deposited film 46 is very high, when an etching process including nitrogen is performed, nitriding reaction occurs in a film constituting a TMR element inside the re-deposited film 46, and the element characteristics may be deteriorated.

As in this embodiment, when a mixed gas of a Xe gas and an $N_2$ gas is used, it is possible to prevent the process for converting the re-deposited film 46 into an insulator from being applied to inside of the element in comparison with a case of using a mixed gas of an Ar gas and an $O_2$ gas or using an $N_2$ gas singly. Consequently, it is possible to improve uniformity of TMR element characteristics for each substrate.

Further, it is possible to stably perform nitriding processing with respect to fluctuation of each introduction amount of an $N_2$ gas and a Xe gas, a change in a plasma density, and a minute change in process conditions, such as temperature changes in the bell jar 4 and the grid 9, determined when the IBE processing is performed.

Meanwhile, when the supply of active nitrogen fails in the processing using a mixed gas of an Ar gas and an $N_2$ gas, a supply source may be provided separately. When an excessive amount of active nitrogen is supplied, the content of nitrogen is reduced to the minimum necessary, whereby damage due to nitrogen ion irradiaLion can be further reduced. When the content of an $N_2$ gas in a mixed gas is reduced, a change in a nitriding power due to fluctuation of an $N_2$ gas introduction amount easily appears, and therefore this embodiment is effective particularly.

When nitriding reaction is performed, a nitrogen-containing gas other than an $N_2$ gas is introduced into the plasma generation chamber to form a plasm, and an ion beam extracted from the plasma can be applied to the re-deposited film 46. In order to perform nitriding at a practical rate, atomic nitrogen or its ion is used rather than a nitrogen molecule or its ions. Accordingly, when an amount of atomic nitrogen produced by dissociation of an $N_2$ gas is small, a mixed gas of ammonia or nitrogen and hydrogen is preferably used as a gas containing nitrogen. In a gas, such as $N_2O$, containing nitrogen and oxygen, a generation speed of an oxide is significantly higher than the generation speed of a nitride, and thus this gas is not suitable for a nitriding gas.

EXPLANATION OF REFERENCE NUMBERS

1: substrate processing chamber
2: plasma generation chamber
3: exhaust pump
4: bell jar
5: gas introduction portion
6 antenna
7: matching device
8: electromagnetic coil
9: grid
9a: first electrode
9b: second electrode
9c: third electrode
10: IBE apparatus
11: substrate
12: power supply for discharge
13: neutralizer
14: position sensor
15: substrate holder
16: substrate carry-in entrance
17: electrode for first electrode
18: electrode for second electrode
20: P-TMR element
21: substrate
22: buffer layer
23: buffer layer
24: free layer
25: tunnel barrier layer
26: first reference layer
27: second reference layer
28: orientation isolation layer
29: third reference layer
30: nonmagnetic interlayer
31: fourth reference layer
32: cap layer
40: substrate
41: seed layer
42: free layer
43: tunnel barrier layer
44: reference layer
45: cap layer
46: re-deposited layer

The invention claimed is:

1. A process for producing a magnetoresistive effect element having two ferromagnetic layers and a tunnel barrier layer located between the two ferromagnetic layers, the process comprising a step of applying an ion beam to a metal material adhered to the side wall of the tunnel barrier layer, wherein the ion beam is formed using a plasma of a Kr gas or a Xe gas,
an energy of the ion beam is not less than 10 eV and not more than 100 eV, and
the metal material contains noble metal atoms and other metal atoms, and the noble metal atoms are selectively etched away from the other metal atoms in the metal material by using the ion beam.

2. The process for producing a magnetoresistive effect element according to claim 1, wherein after the application of the ion beam, the metal material is converted into an insulator using a plasma of a reactive gas.

3. The process for producing a magnetoresistive effect element according to claim 2, wherein the reactive gas is a nitrogen-containing gas.

4. The process for producing a magnetoresistive effect element according to claim 3, wherein the nitrogen-containing gas is an $N_2$ gas or an ammonia gas.

5. The process for producing a magnetoresistive effect element according to claim 1, further comprising, after the application of the ion beam, a step of applying an ion beam, formed using a plasma of a reactive gas, to the metal material,
wherein the reactive gas is an oxygen-containing gas.

6. The process for producing a magnetoresistive effect element according to claim 5, wherein the oxygen-containing gas is an $O_2$ gas.

7. The process for producing a magnetoresistive effect element according to claim 1, wherein a reactive gas is added to the Kr gas or the Xe gas.

8. The process for producing a magnetoresistive effect element according to claim 7, wherein the reactive gas is an oxygen-containing gas.

9. The process for producing a magnetoresistive effect element according to claim 8, wherein the oxygen-containing gas is an $O_2$ gas.

10. The process for producing a magnetoresistive effect element according to claim 7, wherein the reactive gas is a nitrogen-containing gas.

11. The process for producing a magnetoresistive effect element according to claim 10, wherein the nitrogen-containing gas is an $N_2$ gas or an ammonia gas.

12. The process for producing a magnetoresistive effect element according to claim 1, wherein the magnetoresistive effect element is a perpendicular magnetization magnetoresistive effect element comprising the two ferromagnetic layers magnetized in a film-thickness direction.

13. The process for producing a magnetoresistive effect element according to claim 1, wherein only noble metal atoms are selectively etched away from the other metal atoms in the metal material by using the ion beam.

* * * * *